(12) United States Patent
Gauthier et al.

(10) Patent No.: US 6,639,439 B2
(45) Date of Patent: Oct. 28, 2003

(54) REDUCING VOLTAGE VARIATION IN A PHASE LOCKED LOOP

(75) Inventors: Claude R. Gauthier, Fremont, CA (US); Pradeep R. Trivedi, Sunnyvale, CA (US); Dean Liu, Sunnyvale, CA (US); Brian Amick, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/981,385

(22) Filed: Oct. 16, 2001

(65) Prior Publication Data

US 2003/0071667 A1 Apr. 17, 2003

(51) Int. Cl.[7] ................................................. H03L 7/06
(52) U.S. Cl. ........................................ 327/156; 327/551
(58) Field of Search ................................. 327/156–159, 327/551–559

(56) References Cited

U.S. PATENT DOCUMENTS 5,627,736 A * 5/1997 Taylor .......................... 363/39
5,949,279 A * 9/1999 Kwan .......................... 327/545

* cited by examiner

*Primary Examiner*—Kenneth B. Wells
(74) *Attorney, Agent, or Firm*—Rosenthal & Osha L.L.P.

(57) ABSTRACT

A method for reducing voltage variation in the power supply system of a phase locked loop has been developed. The method includes powering up a phase locked loop and activating or inserting a shunting resistance across the power supply terminals. The shunting resistance is inserted in parallel with the phase locked loop, and is controllable such that the resistance can be selectively switched 'on' and/or 'off.'

16 Claims, 2 Drawing Sheets

REDUCING VOLTAGE VARIATION IN A PHASE LOCKED LOOP

BACKGROUND OF INVENTION

1. Field of the Invention

The invention relates generally to circuit design. More particularly, this invention relates to a method for reducing voltage variation in a phase locked loop.

2. Background Art

In electronic circuits, the system power supply can be shown as an equivalent circuit 10 as shown in FIG. 1. Specifically, the equivalent circuit 10 includes: a system power supply source 12; a system resistance (Rs) 14; a system inductance (Ls) 16; and a chip capacitance (Rc) 18. Each of these system components 12, 14, 16, and 18 represent an equivalent value of all of the combined respective components in the power supply system. The performance of the circuit 10 is frequency dependent. As shown in the graph of FIG. 2, as the frequency of the system increases, the resistance of the circuit increases as well. This increase in resistance continues until a peak 20 is reached at a resonance frequency. Finally, the resistance will subside at even higher frequencies.

The rate of increase in the resistance of the circuit as the frequency approaches its resonance value is quantified as a "Q" value. The "Q" value is calculated as $Q=(\sqrt{(L/C)})/R$; where L is the system inductance value; where C is the system capacitance value; and where R is the system resistance value. As shown in FIG. 2, under normal operations, the equivalent circuit 10 has a very high Q value 24 near the resonance frequency. A high current transient with the high Q region of the frequency band causes significant noise in the power supply system. Supply noise can result in such problems as voltage variation, signal jitter, signal stability, component or logic malfunction, signal interference, etc. For instance, a PLL circuit will have more jitter in the presence of power supply noise, which effectively leads to a reduction in the speed at which a chip can operate. Further, voltage variation is a significant problem because the indeterministic distribution of power to system components can lead to a loss of system performance.

It would be advantageous to decrease the Q value of the power supply system and thereby reduce voltage variation. A reduced Q value 26 is also shown in FIG. 2. This Q value 26 would have the advantage of substantially reducing the voltage variation of the respective system. FIG. 3 shows a prior art method of reducing the Q value for a phase locked loop ("PLL") power supply system. A phase locked loop 32 is a component that may be included in an integrated circuit or "chip". The phase locked-loop 32 is essentially a clock driver that uses feedback to output a clock signal such the clock signal output has a specific phase and frequency relationship to an input signal. Typically, a PLL 32 is used to align a reference clock with a chip clock. This is necessary to ensure proper and synchronized operation of components within a computer system. The phase locked loop 32 is just one of many types of components that are commonly included in an integrated circuit. Each of these components often has a dedicated power supply that is unique and separate from the power supplies of other components. The prior art method used in FIG. 3 involves inserting a decoupling capacitor 34 across the power supply in parallel with the phase locked loop 32. However, the capacitor 34 takes up a significant amount of space on the chip. With chip space at a premium, a space efficient method of reducing voltage variation for a phase locked loop is needed.

SUMMARY OF INVENTION

According to one aspect of the present invention, a method for reducing voltage variation in a phase locked loop comprising supplying power to the phase locked loop and connecting a resistance in parallel with the phase locked loop.

According to another aspect, a method for reducing voltage variation in a phase locked loop comprises step of supplying power to the phase locked loop and step of shunting a resistance in parallel with the phase locked loop.

According to another aspect, an apparatus for decreasing clock jitter in a phase locked loop comprises a phase locked loop, a power supply system connected to the phase locked loop, and a shunting resistor connected across the power supply system in parallel with the phase locked loop.

According to another aspect, an apparatus for reducing voltage variation in a phase locked loop comprises means of supplying power to a phase locked loop, and means of connecting an impedance in parallel with the phase locked loop.

Other aspects and advantages of the invention will be apparent from the following description and the appended claims.

DETAILED DESCRIPTION

Figure 1:
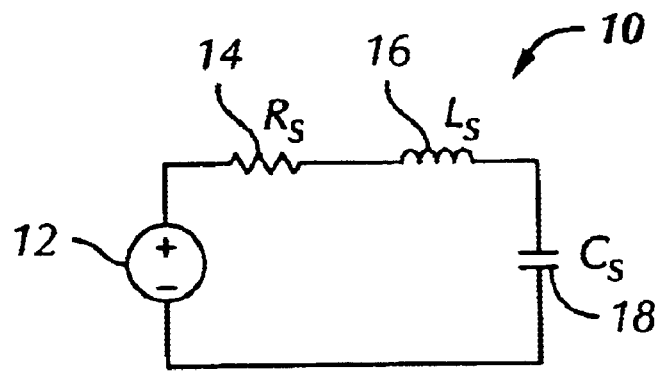
FIG. 1 shows a prior art embodiment of an RLC equivalent power supply system circuit.
Figure 2:
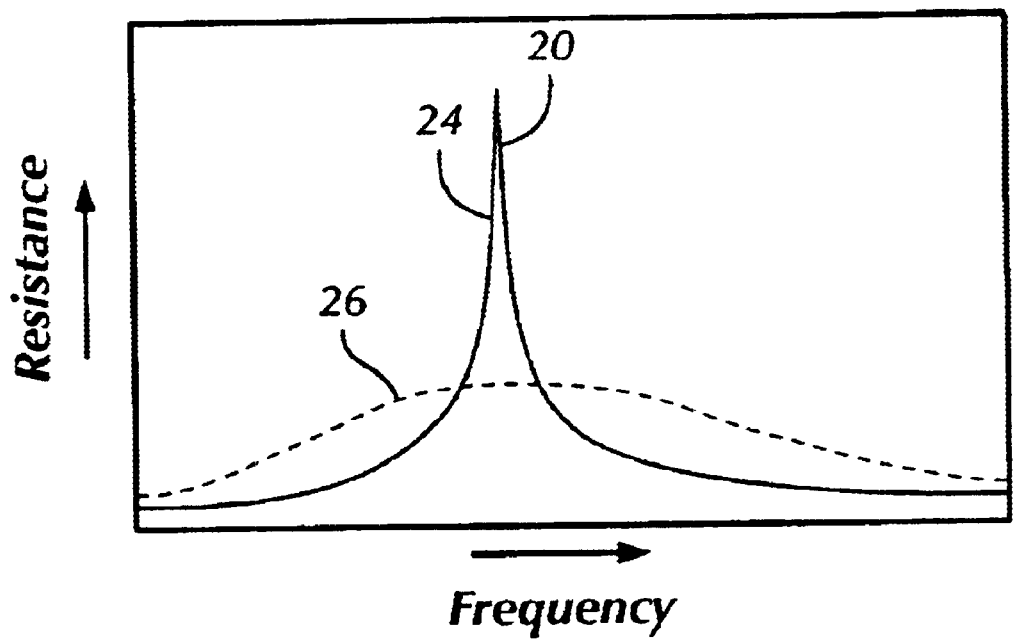
FIG. 2 shows a prior art graph of resistance versus frequency for the circuit shown in FIG. 1.
Figure 3:
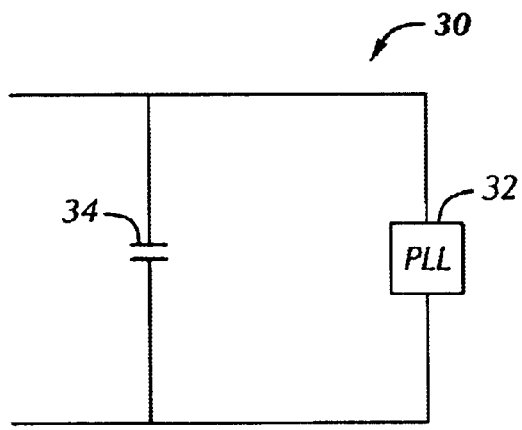
FIG. 3 shows a prior art schematic of a phase locked loop power supply system with a de-coupling capacitor.
Figure 4:
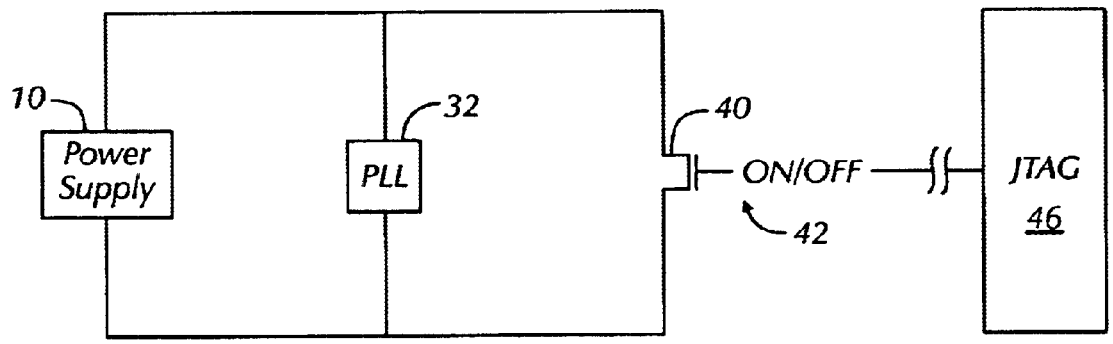
FIG. 4 shows a shunting resistance in accordance with an embodiment of the present invention.

FIG. 4 shows a schematic of one embodiment of the present invention with a parallel shunting resistance. The circuit includes: a phase locked loop 32, and a shunting resistance component 40. The shunting resistor 40 is located in parallel with the phase locked loop 32. In this embodiment, the shunting resistance 40 is shown as an N-type transistor which means that the transistor is "on" (allows current to pass) when the ON/OFF signal 42 is "high". Conversely, the transistor 58 is "off" (does not allow current to pass) when the ON/OFF signal 42 is "low."

The effect of adding a resistance value in parallel with the component served by the power supply system has the effect of lowering the Q value and consequently of lowering the voltage variation across the phase locked loop 32. Decreasing the voltage variation across the phase locked loop 32 leads to increased predictability of power supplied to the phase locked loop 32, effectively leading to less clock jitter on the clock signal output from the phase locked loop 32. Those skilled in the art will appreciate that a reduction of variation by 50% may result in a corresponding reduction in clock jitter of 50%. In this embodiment, a transistor is used to provide a small amount of resistance to lower the Q value of the phase locked loop power supply. In this embodiment, the transistor is controlled with an ON/OFF signal 42. When the ON signal is activated, the transistor makes a connection in parallel across the power supply of the phase locked loop 32. The connection allows current to flow through the transistor, which acts as a relatively small resistor.

Figure 5:
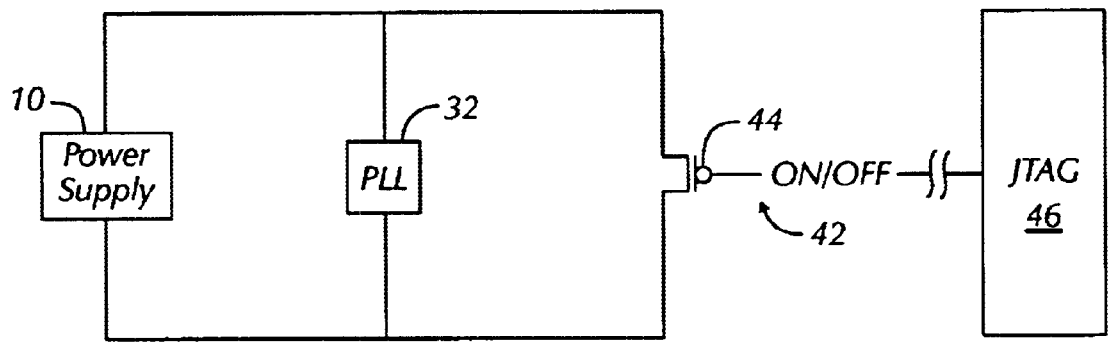
FIG. 5 shows a shunting resistance in accordance with an alternative embodiment of the present invention.

FIG. 5 shows a schematic of one embodiment of the present invention with a parallel shunting resistance. The circuit includes: a phase locked loop 32, and a shunting resistance component 44 that is located in parallel with the phase locked loop 32. However, in this embodiment, the shunting resistance component 44 is a "P-type" transistor which means that the transistor is "on" (allows current to pass) when the ON/OFF signal 42 is low. Conversely, the transistor 56 is "off" (does not allow current to pass) when the ON/OFF signal 42 is high or ON. The P-type transistor operates in the same manner as the N-type transistor, except that it is activated off by the inverse signals. Consequently, the circuit in shown in FIG. 5 will operate in the same manner as the circuit in FIG. 4 except that it will be turned ON and turned OFF by an inverted signal.

While each of these embodiments has shown the shunting resistance component as a transistor, it should be clear to those of ordinary skill in the art that alternative shunting devices could be used. For example, a simple resistor located in parallel with the phase locked loop could perform the same function. Alternatively, a variable resistor could be used as well. Additionally, a simple switch could be added in series with the alternative type of resistance to control the shunting operation.

The ON/OFF signal 42 may be connected to an external circuit interface. In some embodiments, an industry standard interface such as "JTAG" could be used. However, any other suitable interface known to those of ordinary skill in the art could also be used. The purpose of the external interface is externally control of the shunt resistance. Alternatively, the ON/OFF signal 42 may be controlled by a particular program. In either event, the implementation of the ON/OFF signal 42 allows for greater flexibility in operating the circuit.

Advantages of the present invention may include one or more the following. In some embodiments, because a shunting resistance is positioned in parallel with a phase locked loop, voltage variation in/across the phase locked loop is reduced, effectively leading to reduced clock jitter and increased performance.

In some embodiments, because a shunting resistance positioned in parallel to a phase locked loop is controllable, power consumption by the shunting resistance can be controlled and/or reduced.

In some embodiments, because a shunt regulation device uses a resistance instead of a capacitance, less integrated circuit area space is used.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for reducing voltage variation in a phase locked loop, comprising:

supplying power to the phase locked loop; and connecting a resistor in parallel with the phase locked loop.

2. The method of claim 1, wherein the resistor is a transistor.

3. The method of claim 2, wherein the transistor comprises an N-type transistor.

4. The method of claim 2, wherein the transistor comprises a P-type transistor.

5. The method of claim 1, wherein the resistor is activated and de-activated independent of the phase locked loop.

6. The method of claim 5, wherein the resistor is activated and de-activated by a signal transmitted from an external system interface.

7. The method of claim 6, wherein the external system interface is a JTAG.

8. A method for reducing voltage variation in a phase locked loop, comprising:

supplying power to the phase locked loop; and shunting a resistor in parallel with the phase locked loop.

9. An apparatus for decreasing clock jitter in a phase locked loop, comprising:

a phase locked loop;

a power supply system connected to phase locked loop; and a shunting resistor connected across power supply system in parallel with the phase locked loop.

10. The method of claim 9, wherein the resistor is a transistor.

11. The apparatus of claim 10, wherein the transistor comprises an N-type transistor.

12. The apparatus of claim 10, wherein the transistor comprises a P-type transistor.

13. The apparatus of claim 9, wherein the shunting resistor is activated and de-activated independent of the phase locked loop.

14. The apparatus of claim 13, wherein the shunting resistor is activated and de-activated by a signal transmitted from an external system interface.

15. The apparatus of claim 14, wherein the external system interface is a JTAG.

16. An apparatus for reducing voltage variation in a phase locked loop, comprising:

means for supplying power to the phase locked loop; and means for connecting resistor in parallel with the phase locked loop.

* * * * *